(12) United States Patent
Morand et al.

(10) Patent No.: US 9,269,570 B2
(45) Date of Patent: Feb. 23, 2016

(54) CONTACT ON A HETEROGENEOUS SEMICONDUCTOR SUBSTRATE

(71) Applicants: COMMISSARIAT A L'ENERGIE ATOMIQUE ET AUX ENERGIES ALTERNATIVES, Paris (FR); STMICROELECTRONICS (CROLLES 2) SAS, Crolles (FR)

(72) Inventors: Yves Morand, Grenoble (FR); Charles Baudot, Lumbin (FR); Fabrice Nemouchi, Moirans (FR)

(73) Assignees: Commissariat a l'énergie atomique et aux énergies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 13/860,845

(22) Filed: Apr. 11, 2013

(65) Prior Publication Data
US 2013/0273722 A1 Oct. 17, 2013

(30) Foreign Application Priority Data

Apr. 12, 2012 (FR) ...................................... 12 53363

(51) Int. Cl.
*H01L 21/02* (2006.01)
*H01L 21/285* (2006.01)

(52) U.S. Cl.
CPC .... *H01L 21/02381* (2013.01); *H01L 21/28518* (2013.01)

(58) Field of Classification Search
CPC ........................... H01L 21/02381; H01L 21/02

USPC ........................................................... 438/478
See application file for complete search history.

(56) References Cited

U.S. PATENT DOCUMENTS

| | | | |
|---|---|---|---|
| 6,399,487 B1 | 6/2002 | Lai et al. | |
| 7,297,589 B2 | 11/2007 | Feng | |
| 2003/0001219 A1* | 1/2003 | Chau et al. | 257/412 |
| 2003/0234439 A1 | 12/2003 | Currie et al. | |
| 2005/0156258 A1* | 7/2005 | Park et al. | 257/412 |
| 2007/0123042 A1 | 5/2007 | Rim et al. | |
| 2007/0187767 A1 | 8/2007 | Yasutake | |
| 2007/0238236 A1* | 10/2007 | Cook et al. | 438/197 |
| 2009/0294871 A1* | 12/2009 | Besser | 257/384 |
| 2010/0001317 A1* | 1/2010 | Chen et al. | 257/192 |
| 2010/0126351 A1* | 5/2010 | Hosokawa et al. | 95/287 |
| 2011/0143534 A1 | 6/2011 | Carron et al. | |

OTHER PUBLICATIONS

French Preliminary Search Report issued Dec. 18, 2012, in French Application No. 12 53363 filed Apr. 2, 2012 (with English Translation of Categories of Cited Documents).

(Continued)

*Primary Examiner* — Jerome Jackson, Jr.
*Assistant Examiner* — Lamont Koo
(74) *Attorney, Agent, or Firm* — Oblon, McClelland, Maier & Neustadt, L.L.P.

(57) ABSTRACT

A method is provided for producing a microelectronic device with plural zones made of a metal and semiconductor compound, from semiconductor zones made of different semiconductor materials, and on which a thin semiconductor layer is formed prior to the deposition of a metal layer so as to lower the nucleation barrier of the semiconductor zones when reacting with the metal layer.

17 Claims, 5 Drawing Sheets

(56) References Cited

OTHER PUBLICATIONS

C. Lavoie, et al., "Effects of Alloying Elements on Cobalt Silicide Formation", Journal of Electronic Materials, vol. 31, No. 6, 2002, pp. 597-609.

S. Gaudet, et al., "Thin film reaction of transition metals with germanium", J. Vac. Sci. Technol. A 24(3), May/Jun. 2006, pp. 474-485.

F. Nemouchi, et al., "Dopant Effect on NiGe Texture During Nickel Germanide Growth", ECS Transactions, 6 (16), 2007, pp. 49-59.

* cited by examiner

CONTACT ON A HETEROGENEOUS SEMICONDUCTOR SUBSTRATE

TECHNICAL FIELD

The present invention relates to the field of semiconductor devices, and refers in particular to a method for producing a semiconductor device including regions made of different semiconductor materials which are covered and in contact with zones made of different semiconductor and metal alloys or different semiconductor and metal compounds, or having different respective compositions.

This method enables to form, at low temperature, semiconductor- and metal-based compounds from different semiconductor materials.

The present invention applies in particular to the production of contact zones for microelectronic devices including semiconductor zones formed from different semiconductor materials.

PRIOR ART

In certain applications it is sometimes sought to produce microelectronic devices including different semiconductor materials.

In such devices, in order to produce electrical contacts in semiconductor zones, it is known to form regions in these semiconductor zones consisting of a metal-semiconductor alloy. Such metal-semiconductor alloy is conventionally formed by depositing a metal on the semiconductor zones, and further conducting a thermal treatment for a given duration and at a given temperature.

In connection, for example, with photon applications, a co-integration of different semiconductor materials on a given support can be sought: for example, one or more germanium zones used for photon detection, together with one or more silicon zones.

The conditions for producing metal-semiconductor compounds from different semiconductor materials vary significantly from one semiconductor material to another.

In particular, the formation temperature and thermal stability conditions may differ from one compound to another.

A simultaneous formation of several regions made of a metal-semiconductor compound starting from zones of different semiconductor materials is therefore difficult to implement.

When it is desired, for example, to produce contact regions on a device which has both silicon and germanium zones, it is known to use Ni to produce metal-semiconductor alloy regions having low contact resistance.

Formation of nickel- and semiconductor-based compounds differs greatly from one semiconductor to another.

In addition, there is an optimum interval of thermal treatment temperatures to enable semiconductor- and Ni-based compounds of low resistivity to be obtained. This interval is not the same between silicon and germanium.

The window in which the optimum temperature intervals overlap to form NiSi and NiGe is small, and is found at high temperatures, generally of between 350° C. and 430° C.

The problem of producing metal-semiconductor alloy zones of low resistivity from different semiconductor materials, whilst using a limited thermal budget, is therefore posed.

DESCRIPTION OF THE INVENTION

The present invention relates to a method for producing a semiconductor device including multiple zones made of a compound of a metal material and of a semiconductor material, including steps consisting in:

forming, on a support including at least one first semiconductor zone made of a first semiconductor material, and at least one second semiconductor zone made of a second semiconductor material, which is different from the first semiconductor material, a thin semiconductor layer in contact with the first semiconductor material and the second semiconductor material, depositing a metal layer on said thin semiconductor layer, applying a thermal treatment or annealing for a given duration and at a given temperature so as to form at least one first region made of a first compound of metal material and semiconductor material on said first semiconductor zone, and at least one second region made of a compound of metal material and semiconductor material on said second semiconductor zone.

Formation of a compound of metal and semiconductor by reaction in the solid state involves in particular a phase of nucleation.

The thin semiconductor layer is specified with a thickness and a semiconductor material, which themselves are provided such that it has a nucleation barrier which is lower than the barrier of at least said first semiconductor zone.

If the nucleation phase is facilitated the formation of zones of alloys or compounds of semiconductor and metal having different compositions may thus be facilitated, whilst the thermal budget required to form these alloys or compounds is reduced.

The thin semiconductor layer is preferably continuous. The thin semiconductor layer is preferably thicker than the critical size of the nuclei of the compounds pending formation or intended to be formed.

According to one possibility for implementation, of the method, the first semiconductor material may be Si.

In this case, the thin semiconductor layer is specified to be made of a semiconductor material having, for a volume and equal areas of material, a nucleation barrier lower than the barrier of said first semiconductor zone.

The thin semiconductor layer may in particular be made of Ge or SiGe.

According to one possibility of implementation, the second semiconductor material may be Ge or SiGe based.

The method may also include, after said step of annealing, a step consisting of removing the remaining portion of said metal layer which has not reacted.

The given duration of said annealing, the given temperature of said annealing, and the thickness of the metal layer, can all be provided such that the given semiconductor material of the said thin semiconductor layer is completely consumed. When the semiconductor material of said thin semiconductor layer and the semiconductor material of said first semiconductor zone are different, preservation of an interface formed between the semiconductor material of the said thin semiconductor layer and the semiconductor material of said first semiconductor zone, which may be deleterious in terms of resistance of access to the first semiconductor zone, is prevented.

After the removal of a remaining portion of said metal layer, the method may also include one or more additional annealing step(s).

According to one possibility for implementation of the method, said metal layer may be made of Ni.

According to one possibility for implementation of the method, the annealing may be accomplished in an oxidising atmosphere. This may enable the untimely formation of cavities or of holes between the semiconductor zones and the regions made of compounds of semiconductor and metal to be prevented.

The present invention also relates to a semiconductor device produced with a method as previously defined, said device having multiple zones made of a compound of metal material and semiconductor material, the device further including at least one first region made of a first compound made of metal and semiconductor lying on a first semiconductor zone, and at least one second region made of a compound of metal and semiconductor lying on a second semiconductor zone, the second compound being different from the first compound.

BRIEF DESCRIPTION OF THE ILLUSTRATIONS

The present invention will be better understood on reading the description of examples of embodiment given, purely as an indication and in no sense restrictively, making reference to the appended illustrations in which.

Figure 4:
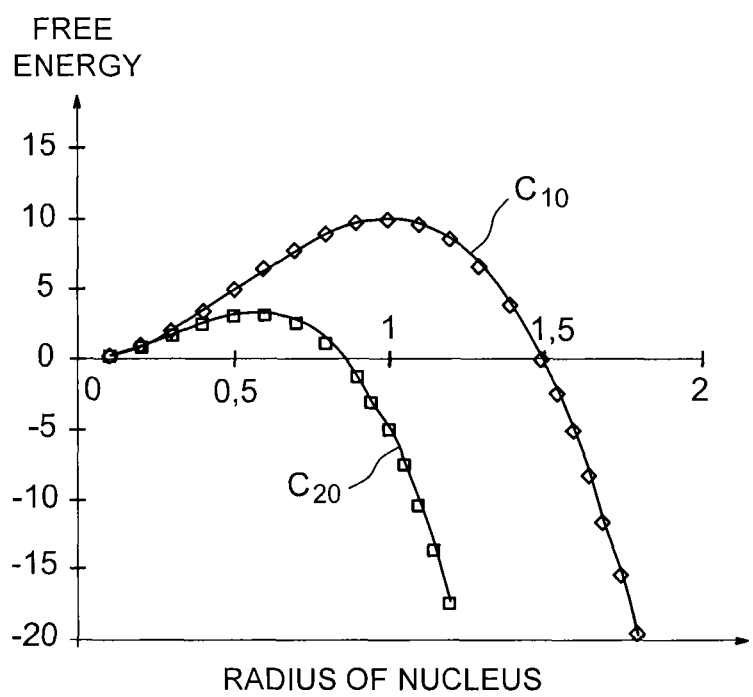

FIG. 4 gives examples of curves of changes of free energy of nuclei made respectively of silicon and made of germanium, as a function of the radii of the nuclei.

The various parts represented in the figures are not necessarily represented at a uniform scale, in order to make the figures more readable.

DETAILED DESCRIPTION OF PARTICULAR EMBODIMENTS

An example of a method for producing a semiconductor device, in particular a microelectronic device having on a given support at least one first zone made of an alloy or of a compound made of a first semiconductor material and of a given metal material, and of at least one second zone made of an alloy, or of a compound, made of a second semiconductor material and the said metal material, will now be given.

The method's initial material can be a support 100 including a first zone 104 which is made of a first semiconductor material, for example silicon, together with a second zone 108 made of a second semiconductor material, for example germanium.

Figure 1A:
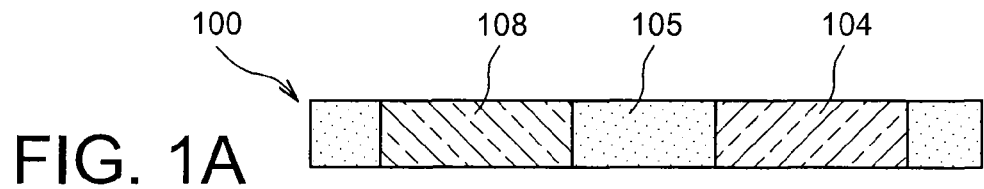
FIGS. 1A-1E illustrate an example of a method according to the invention, for producing zones of alloy of metal and semiconductor of different compositions from zones of different semiconductor materials positioned on the same support.

Semiconductor zones 104 and 108 may be separated from one another by an insulating zone 105 made of at least one dielectric material, such as for example $SiO_2$ (FIG. 1A).

Figure 1B:
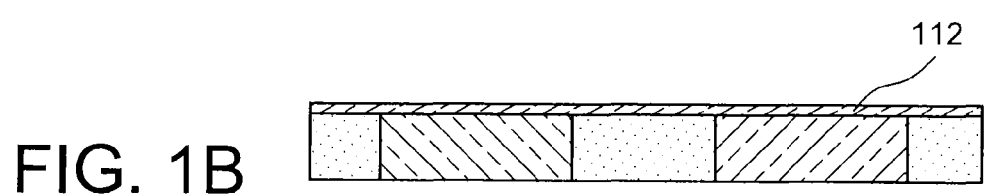

A thin semiconductor layer 112 covering, and in contact with, first semiconductor zone 104 and second semiconductor zone 108 is then formed, for example by deposition (FIG. 1B).

Thin semiconductor layer 112 is made of a given semiconductor material, for example germanium, and specified with a given thickness, which is less than that of semiconductor zones 104 and 108.

The thickness of thin semiconductor layer 112 may be, for example, between 1 nm and 30 nm, and is preferably between 5 nm and 20 nm.

The formation of thin semiconductor layer 112 may be preceded by cleaning of the support, and in particular of semiconductor zones 104, 108, so as to remove any contaminants and a possible thin layer of semiconductor oxide which might be formed.

The formation of thin semiconductor layer 112 may also be followed by more cleaning prior to the formation of a metal layer 116. Such cleaning may enable the inhibition of a reaction between a metal or a metal material and the respective semiconductor materials of semiconductor zones 104, 108 to be prevented, in later steps of the method. Such cleaning may be accomplished, for example, using an aqueous acid solution such as diluted HF, or may also be accomplished or completed by cleaning using a plasma, for example an argon-based plasma or a diverted plasma, for example one based on ammonia and fluorine.

Figure 1C:
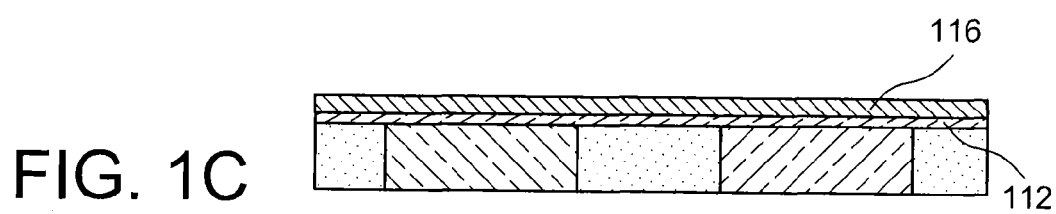

A metal layer 116 is then formed on thin semiconductor layer 112. This metal layer 116 may be made of a metal such as, for example, Ni or Pt or Pd or Ti or Co, or an alloy of the above mentioned elements can be envisaged (FIG. 1C).

The maximum thickness of thin semiconductor layer 112 can be provided in accordance with that of metal layer 116 with which it is intended to react.

Thin semiconductor layer 112 is intended to be completely consumed at a later stage. The maximum thickness of thin semiconductor layer 112 may thus be provided using a ratio of atomic volumes of the element in question in its matrix.

In the case of a thin semiconductor layer 112 made of Ge which it is intended to react with a layer of Ni, thickness $E_{Ge}$ of the layer of Ge is specified such that: $E_{Ge} < 1.6 E_{Ni}$, where $E_{Ni}$ is the thickness of the layer of Ni.

Metal layer 116 may be deposited so as to cover completely the face of support 100 on which thin semiconductor layer 112 has been produced. The metal material may be deposited by evaporation under an electron beam, or by chemical vapour deposition, or electrochemical deposition, or preferentially by physical vapour deposition, since PVD deposition allows precise control of the thickness of metal layer 116 and of the conditions ensuring a high degree of purity of the material of metal layer 116.

Produced metal or metal alloy layer 116 may be, for example, between 1 nm and 50 nm thick.

Metal and semiconductor alloy regions 134 and 138 are then formed on semiconductor zones 104 and 108, respectively.

To accomplish this, a first thermal treatment, also called an annealing, may then be conducted.

This annealing may be accomplished in a vacuum or in a controlled atmosphere. This annealing is also accomplished at a given temperature and over a given duration, in accordance with the respective thicknesses of thin semiconductor layer 112, of semiconductor zones 104 and 108, and of their respective semiconductor materials.

For example, when semiconductor zones 104 and 108 are between 20 nm and 50 nm thick, and when thin semiconductor layer 112 is, for example, between 10 nm and 15 nm thick, this first annealing may be undertaken at 220° C. and over a duration of, for example, between 30s and 90s.

The formation of a compound of metal and semiconductor by reaction at the solid state involves several steps: a phase of nucleation, a phase of lateral growth or coalescence, and a phase of thickness growth.

The thickness and the semiconductor material of thin semiconductor layer 112 are chosen such that it has a nucleation barrier which is lower than the barrier of at least one of semiconductor zones 104 or 108.

The term nucleation barrier signifies an energy required to enable a nucleation to be accomplished from a semiconductor zone.

According to one possibility, the thin semiconductor layer 112 may be chosen such that it is made of one of the semiconductor materials among the first semiconductor material and the second semiconductor material having, for equal thermodynamics conditions and equal dimensions, the lower nucleation barrier.

A step of nucleation in a semiconductor zone requires an energy commonly called the Gibbs energy, which depends both on a term $a.\sigma r^2$ relating to its area (where a is a geometrical term, $\sigma$ the surface energy of the new phase and r the radius of the nucleus), and a term $b.\Delta G_v.r^3$ relating to its volume (where b is a geometrical term, $.\Delta G_v$ the volume energy of the new phase and r the radius of the nucleus). Factors $\sigma$ and $.\Delta G_v$ depend on the materials present.

The nucleation phase, which depends on the nucleation barrier of the materials present, consumes large quantities of energy. For equal areas and equal volumes the nucleation barrier is lower for germanium than for silicon, and for SiGe than for Si.

If zone 104 and zone 108 are made respectively of silicon and germanium, thin layer 112 is thus made from a semiconductor material chosen such that it has a lower nucleation barrier than the nucleation barrier of silicon zone 104.

If zone 104 and zone 108 are made respectively of silicon and germanium, the choice may then be made to make thin layer 112 of Ge, since a zone of Ge has a lower nucleation barrier than a zone of Si of the same dimensions, as is illustrated, for example, in FIG. 4 which, for example, gives curves $C_{10}$ and $C_{20}$ of change of nucleation energy of a zone of Si (curve $C_{10}$) and of a zone of Ge (curve $C_{20}$) according to the radius of a new phase.

This first step of annealing may be accomplished so as to form a layer (not shown) of alloy of metal and semiconductor containing regions 134 and 138 of metal-rich metal-semiconductor compounds in semiconductor zones 104, 108, respectively.

Figure 1D:
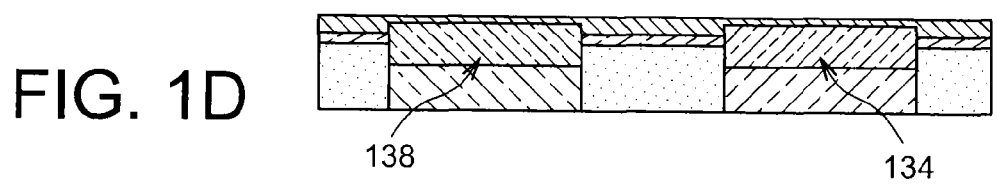
Figure 1E:
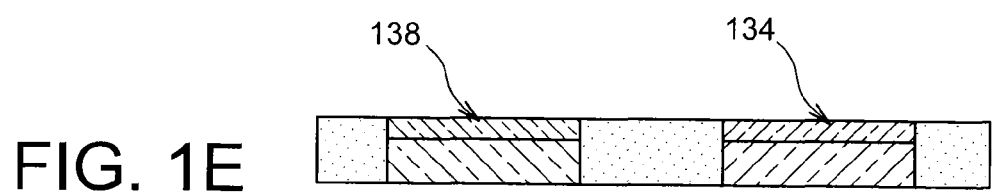

This alloy layer includes at least one first region 134 made of at least one metal-rich metal-semiconductor alloy $M_{1-x}(Si_{1-y}Ge_y)_x$, where M may be Ni (FIG. 1D).

The alloy layer includes at least one second region 138 made of another metal-rich metal-semiconductor alloy $M_{1-x}(Ge)_x$, where M may be Ni (FIG. 1D).

The presence of thin semiconductor layer 112 made of Ge enables the thermal budget for simultaneous production of zones of alloy of semiconductor and metal to be reduced. When zones 104 and 108 are made respectively of Si and Ge, and when metal layer 116 is made of Ni, the annealing may be accomplished, for example, at a temperature of, for example, between 150° C. and 250° C. After this, according to a first alternative, a selective removal of the metal which has not reacted at the surface of the dielectric zones, and possibly at the surface of the alloy layer can then be accomplished. This selective removal can be accomplished using a chemical solution enabling the metal layer to be etched selectively with regard to the silicide. When the metal layer is made of Ni, a type of removal using a chemical solution commonly called Caro ($H_2O_2$; $H_2SO_4$; $H_2O$), heated to between 30° C. and 70° C. or made of (HF; HCl), may be used.

According to another alternative, a second thermal treatment, in a vacuum or in a controlled atmosphere, may be applied. Such a treatment enables the composition of regions 134, 138 of compounds or alloys of metal material and semiconductor, formed respectively in semiconductor zones 104, 108, to be modified.

Such a thermal treatment may enable regions 134, 138 made of a compound of metal material and semiconductor, having lower resistances, to be implemented.

For the method which has just been described, the thickness of metal of layer 116, and the thermal treatment or treatments applied, in particular the time-temperature pair(s) of the annealing or annealings applied, are adjusted such that the deposited thin semiconductor layer 112 is entirely consumed.

If thin semiconductor layer 112 is made of Ge, then by completely consuming this thin layer 112 preservation of a Ge/Si interface in semiconductor zone 104, which would give this zone a high access resistance, is thus prevented.

When metal layer 116 and thin semiconductor layer 112 are made respectively of Ni and Ge, and when first semiconductor zone 104 and second semiconductor zone 108 are made respectively of Si and Ge, during the thermal annealing or annealings, a zone of NiGe tends to be formed in zone 108 made of germanium and a zone of $Ni_{1-x}(Si_{1-y}Ge_y)_x$ tends to be formed in zone 104 made of silicon.

According to one implementation possibility, the formation annealing may be accomplished in a vacuum or in an inert atmosphere of $N_2$, Ar, He, in particular when the annealing temperatures are below 400° C.

To prevent a possible formation of cavities above semiconductor zones 104, 108 between the latter and the zones of compound or of metal-semiconductor alloy which have been produced, the first annealing and/or the thermal annealing or annealings accomplished after deposition of metal layer 116 may be accomplished in an oxidising atmosphere, for example as described in patent US 2011/0143534.

Another example method will be given in connection with FIGS. 2A-2E.

In this example the method is undertaken on a heterogeneous structure including several semiconductor zones made of different materials. This heterogeneous structure may be an optoelectronic device, one or more components of which are in the course of being produced.

This device includes one or more optical components, such as, for example, an optical fibre coupler $C_1$, and a waveguide $C_2$ and/or one or more optoelectronic components such as, for example, a photodetector $C_3$, and an optical modulator $C_4$. Coupler $C_1$, waveguide $C_2$, photodetector $C_3$, and optical modulator $C_4$, have been produced from zones or from a layer made of a first semiconductor material 201, for example silicon.

Photodetector $C_3$ is formed from a semiconductor block 208 or a semiconductor zone 208 made of another semiconductor material, for example germanium, lying on first semiconductor material 201. Zone 208 of the photodetector includes an N-doped semiconductor region 208a, a region 208b of intrinsic semiconductor material, and another, P-doped, semiconductor region 208c.

Figure 2A:
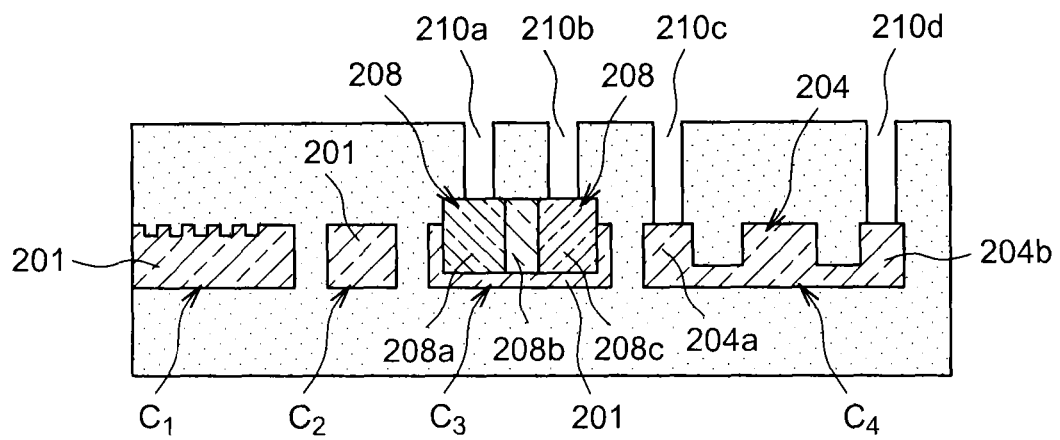
FIGS. 2A-2E illustrate another example of a method according to the invention, for producing metal-semiconductor alloy zones on components of a microelectronic device from zones of different semiconductor materials.

Optical modulator $C_4$ is formed of a zone 204 made of first semiconductor material 201 and includes an N-doped region 204a, and also a P-doped region 204b (FIG. 2A).

Components $C_1$, $C_2$, $C_3$, $C_4$, are covered with masking (not shown), formed for example from an insulating material such as $SiO_2$, and including apertures 210a, 210b, respectively revealing N-doped region 208a of zone 208 of the photodetector, and P-doped region 208c of the photodetector, together with apertures 210c, 210d, respectively revealing N-doped region 204a of the modulator, and P-doped region 204b of the modulator.

Figure 2B:
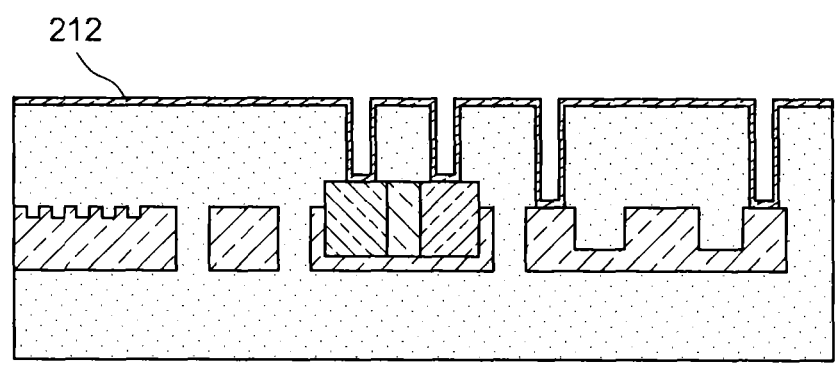

After this a thin semiconductor layer 212, made of a semiconductor material chosen such that it has a nucleation barrier lower than that of the semiconductor material from among the semiconductor materials forming respectively modulator $C_4$ and photodetector $C_3$ having the higher nucleation barrier, is then formed (FIG. 2B).

For example, if the semiconductor material forming modulator $C_4$ is Si and if the semiconductor material forming photodetector $C_3$ is Ge, thin semiconductor layer 212 can be, for example, made of Ge.

Thin semiconductor layer 212 can be made by conformal deposition so as to cover at the base of apertures 210d, 210c, 210b, 210a regions 204b, 204a, 208c, 208a. Thin semiconductor layer 212 is, for example, between 2 nm and 10 nm thick.

Prior to deposition of thin layer 212, regions 204b, 204a, 208c, 208a may have been cleaned.

Figure 2C:
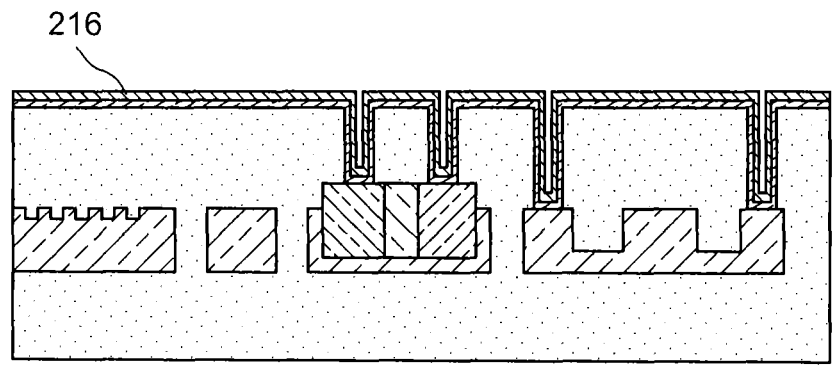

After having formed thin semiconductor layer 212 a layer of metal material 216, for example made of Ni, is deposited in a conformal manner, and in order to cover thin semiconductor layer 212. The deposition of metal layer 216 can be accomplished so as not to fill completely apertures 210d, 210c, 210b, 210a (FIG. 2C).

A thermal treatment or an annealing is then accomplished to produce a compound made of metal and semiconductor. The annealing is undertaken, for example, at a temperature of between 250° C. and 350° C. for a period, for example, of between 20 second and 120 second.

Figure 2D:
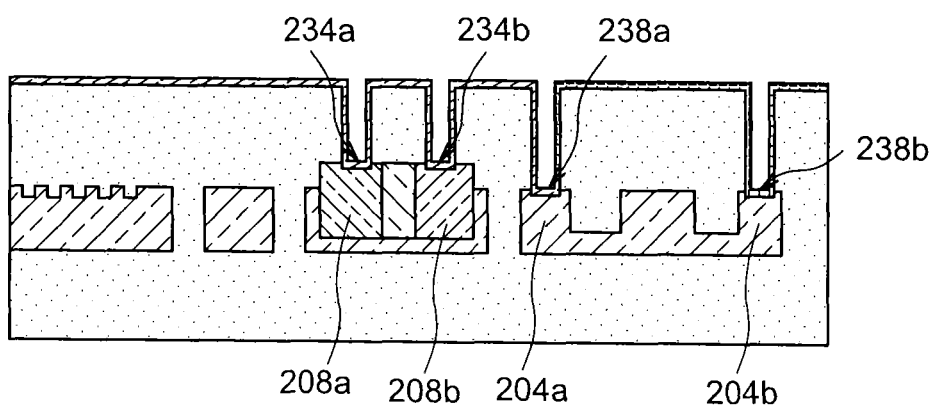
Figure 2E:
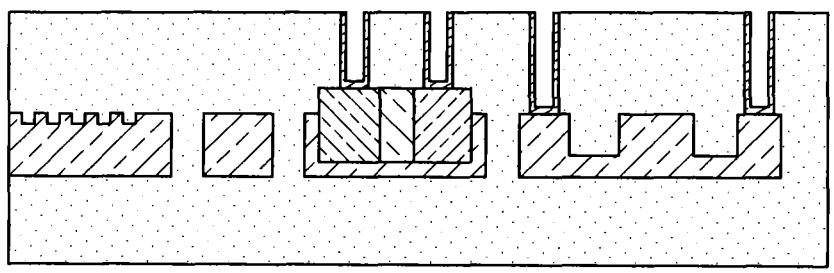

This annealing is accomplished so as to consume completely the semiconductor material of thin semiconductor layer 212, and to consume partially the semiconductor material of regions 208a, 208c, 204a, 204b, Zones 234a, 234b, 238a, 238b, made of a compound formed of semiconductor material and metal are thus produced in apertures 210a, 210b, 210c, 210d (FIG. 2D).

Another annealing can then be accomplished. This other annealing can be a stabilisation annealing, or an annealing intended to enable the reaction between the metal material and the semiconductor materials to be completed.

After this, the layer lying on the masking formed by reaction during the annealing between thin semiconductor layer 212 and layer of metal material 216 (FIG. 2E) are removed.

Figure 3A:
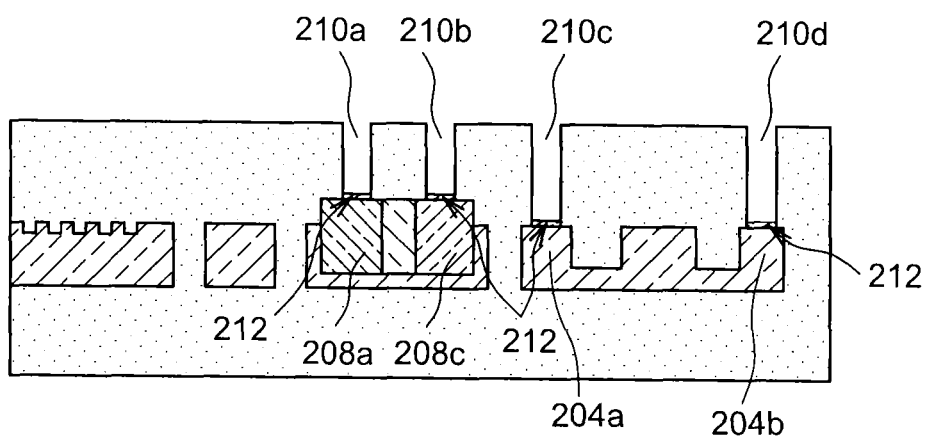
FIGS. 3A-3B illustrate a variant of an example of a method according to the invention.

According to one variant of the method which has just been described, thin semiconductor layer 212 is produced by selective formation in regions 208a, 208c, 204a, 204b, revealed respectively by apertures 210a, 210b, 210c, 210d, and so as to cover only these regions (FIG. 3A).

The steps of deposition of the metal layer so as to cover thin semiconductor layer 212 at the base of apertures 210a, 210b, 210c, 210d are then accomplished.

Figure 3B:
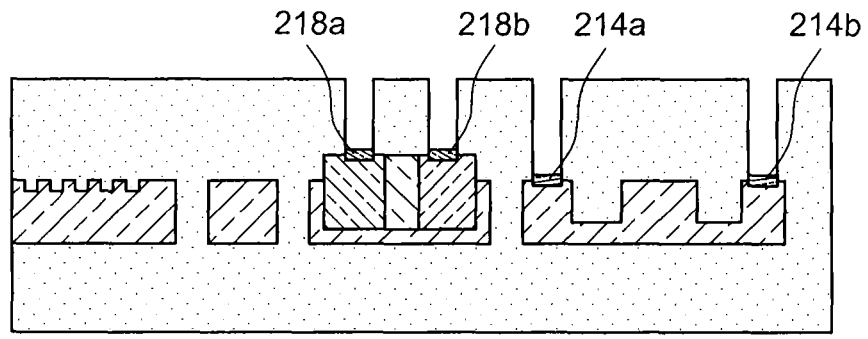

After this, a thermal treatment is accomplished so as to form zones 218a, 218b, made of a compound formed of a metal material and of Ge, and zones 214a, 214b, made of a compound formed of a metal material, Si and Ge (FIG. 3B).

The invention claimed is:

1. A method for producing a semiconductor device including plural zones made of a compound metal and semiconductor based compound, said method comprising:
on a support including at least one first semiconductor zone made of a first semiconductor material, and at least one second semiconductor zone made of a second semiconductor material different from said first semiconductor material: forming a thin semiconductor layer in contact with said first semiconductor material and said second semiconductor material,
wherein the thin semiconductor layer has a thickness and is made from a given semiconductor material, both thickness and material of said thin semiconductor layer being chosen such that said thin semiconductor layer has a nucleation barrier lower than the nucleation barrier of at least one of the said first and second semiconductor zones, the thin semiconductor layer having a higher Ge concentration than the at least one first semiconductor zone made of the first semiconductor material,
wherein, on the support, at least one surface of the at least one first semiconductor zone and at least one surface of the at least one second semiconductor zone are coplanar and are laterally separated by at least one insulating zone, and
wherein, on the support, at least one surface of the at least one insulating zone is coplanar with the at least one surface of the at least one first semiconductor zone and the at least one surface at least one second semiconductor zone;
depositing a metal layer on said thin semiconductor layer; and
annealing for a given duration and at a given temperature so as to form at least one first region on said first semiconductor zone made of a first compound of metal material and said first semiconductor material, and at least one second region on said second semiconductor zone made of a second compound of metal material and said second semiconductor material.

2. The method according to claim 1, wherein said first semiconductor material is Si.

3. The method according to claim 1, wherein said second semiconductor material is Ge or SiGe.

4. The method according to claim 1, wherein said given semiconductor material of said thin semiconductor layer is said second semiconductor material.

5. The method according to claim 1, further comprising, after said annealing step: removing a remaining portion of said metal layer.

6. The method according to claim 5, further comprising, after removal of the remaining portion of said metal layer: at least one additional annealing step.

7. The method according to claim 1, wherein the given duration and the given temperature of said annealing, and the thickness of said metal layer, are provided such that in the course of said annealing the given semiconductor material of said thin semiconductor layer is entirely consumed.

8. The method according to claim 1, wherein said metal layer is made of Ni.

9. The method according to claim 1, wherein the annealing is accomplished in an oxidising atmosphere.

10. The method according to claim 1, wherein the thin semiconductor layer has a higher Ge concentration than the at least one first semiconductor zone made of the first semiconductor material.

11. A method for producing a semiconductor device including plural zones made of a compound metal and semiconductor based compound, said method comprising:
on a support including at least one first semiconductor zone made of a first semiconductor material that is SiGe or Si, and at least one second semiconductor zone made of a second semiconductor material that is Ge: forming a thin semiconductor layer in contact with said first semiconductor zone and said second semiconductor zone, the thin semiconductor layer having a higher Ge concentration than the at least one first semiconductor zone made of the first semiconductor material,
wherein the thin semiconductor layer has a thickness and is made from a given semiconductor material, both thickness and material of said thin semiconductor layer being chosen such that said thin semiconductor layer has a nucleation barrier lower than the nucleation barrier of said first semiconductor zone, wherein, on the support, at least one surface of the at least one first semiconductor zone and at least one surface of the at least one second semiconductor zone are coplanar and are laterally separated by at least one insulating zone, and wherein, on the support, at least one surface of the at least one insulating zone is coplanar with the at least one surface of the at least one first semiconductor zone and the at least one surface at least one second semiconductor zone;

depositing a metal layer on said thin semiconductor layer; and annealing for a given duration and at a given temperature so as to form at least one first region on said first semiconductor zone made of a first compound of metal material and semiconductor material, and at least one second region on said second semiconductor zone made of a second compound of metal material and said second semiconductor material.

12. The method according to claim 11, wherein said metal layer is made of Ni.

13. The method according to claim 11, wherein the annealing is accomplished in an oxidising atmosphere.

14. The method according to claim 11, wherein said thin semiconductor layer is Ge or SiGe.

15. The method according to claim 11, wherein said first semiconductor zone is N-doped and said second semiconductor zone is P-doped.

16. A method for producing a semiconductor device including plural zones made of a compound metal and semiconductor based compound, said method comprising:

on a support including at least one first semiconductor zone made of a first semiconductor material, and at least one second semiconductor zone made of a second semiconductor material different from said first semiconductor material: forming a thin semiconductor layer in contact with said first semiconductor material and said second semiconductor material, wherein the thin semiconductor layer has a thickness and is made from a given semiconductor material, both thickness and material of said thin semiconductor layer being chosen such that said thin semiconductor layer has a nucleation barrier lower than the nucleation barrier of at least one of the said first and second semiconductor zones, wherein, on the support, at least one surface of the at least one first semiconductor zone and at least one surface of the at least one second semiconductor zone are coplanar and are laterally separated by at least one insulating zone, and wherein, on the support, at least one surface of the at least one insulating zone is coplanar with the at least one surface of the at least one first semiconductor zone and the at least one surface at least one second semiconductor zone;

depositing a metal layer on said thin semiconductor layer; and annealing for a given duration and at a given temperature so as to form at least one first region on said first semiconductor zone made of a first compound of metal material and said first semiconductor material, and at least one second region on said second semiconductor zone made of a second compound of metal material and said second semiconductor material, wherein the annealing to form said at least one first region and said at least one second region completely consumes said thin semiconductor layer under said metal layer and over said first and second semiconductor zones, such that a lowermost surface of said at least one first region and a lowermost surface of said at least one second region are disposed below an uppermost surface of the support, wherein annealed material of the at least one second region being a different material than annealed material of the at least one first region.

17. The method according to claim 16, wherein the thin semiconductor layer has a higher Ge concentration than the at least one first semiconductor zone made of the first semiconductor material.

* * * * *